United States Patent [19]

Hughey et al.

[11] Patent Number: 5,238,175
[45] Date of Patent: Aug. 24, 1993

[54] METHOD AND APPARATUS FOR SELECTIVE SOLDERING

[75] Inventors: Ronald R. Hughey, Lee's Summit; Joseph M. Salva, Sugar Creek, both of Mo.

[73] Assignee: AT&T Bell Laboratories, Murray Hill, N.J.

[21] Appl. No.: 921,868

[22] Filed: Jul. 29, 1992

[51] Int. Cl.⁵ .................................... B23K 31/02
[52] U.S. Cl. .............................. 228/180.1; 228/31; 228/223; 228/260
[58] Field of Search ............... 228/31, 223, 180.1, 228/33, 35, 260

[56] References Cited

U.S. PATENT DOCUMENTS

| | | | |
|---|---|---|---|
| 2,313,751 | 3/1943 | Hunter | 228/31 |
| 2,870,532 | 1/1959 | Young | 228/260 |
| 3,605,244 | 9/1971 | Osborne et al. | 228/260 |
| 4,306,674 | 12/1981 | Charles et al. | 228/36 |
| 4,350,602 | 9/1982 | Schiller | 427/444 |
| 4,478,364 | 10/1984 | Ditzig | 228/180.1 |
| 4,720,324 | 1/1988 | Hayward | 29/852 |
| 4,752,027 | 6/1988 | Gschwend | 228/180.2 |
| 5,080,722 | 1/1992 | Englert et al. | 134/26 |
| 5,148,961 | 9/1992 | Humbert et al. | 228/260 |

FOREIGN PATENT DOCUMENTS 2-58895 2/1990 Japan.

OTHER PUBLICATIONS

L. A. Guth and J. R. Morris, "No-Clean Soldering Processes," *AT&T Technical Journal*, pp. 37-44 (Mar.-/Apr. 1992).

Primary Examiner—Samuel M. Heinrich
Assistant Examiner—Jeffrey T. Knapp
Attorney, Agent, or Firm—Lester H. Birnbaum

[57] ABSTRACT

Disclosed is a method and apparatus for applying flux and solder in order to attach connectors to printed circuit boards (PCBs). Flux is applied to the connector tails and the PCB pads by means of a roller mounted above a flux reservoir. The piece parts are then exposed to a solder wave such that the solder sticks only to the selected area to which the flux was applied.

9 Claims, 4 Drawing Sheets

METHOD AND APPARATUS FOR SELECTIVE SOLDERING

BACKGROUND OF THE INVENTION

This invention relates to selective soldering and, in particular, to electrical and mechanical attachment of connectors to printed circuit boards (PCBs).

In the fabrication of circuit packs, electrical connectors are usually mounted on one edge of a printed circuit board. The connectors typically include either pins or pin-receiving receptacles within a housing and tail portions extending therefrom which must be electrically connected to pads on the circuit board. This connection is usually achieved by soldering the tails to the pads. (See, e.g., U.S. Pat. No. 5,080,722 issued to Englert et al.)

One method of soldering components in general involves applying a flux and solder to the piece part and, subsequently, cleaning off the excess material. (See, e.g., U.S. Pat. No. 4,720,324 issued to Hayward and U.S. Pat. No. 4,306,674 issued to Charles et al.) The cleaning, however, generally requires the application of chlorofluorocarbon (CFC), such as FREON®, which is harmful to the environment. While alternative cleaning techniques have been proposed (see Patent to Englert et al. cited above), it is also desirable to eliminate the cleaning step altogether.

One approach to no-clean soldering is to apply the flux in a carefully controlled manner by spraying the entire board and then apply solder by wave soldering. Since only the amount required to ensure a good solder connection is applied, no cleaning is required. (See L. A. Guth and J. R. Morris, "No-Clean Soldering Processes," *AT&T Technical Journal*, pp. 37–44 (March/April 1992).

While such an approach is adequate for soldering components in general to PCBs, attachment of connectors to PCBs present special problems since the PCB pads are usually close to the connector housing and it is generally required to keep flux out of the housing.

SUMMARY OF THE INVENTION

The invention, in one aspect, is a method of soldering a component to pads on a printed circuit board. A flux is applied selectively to the pads by means of a roller which is rotatably mounted above a flux reservoir so that the roller picks up flux from the reservoir and applies it by contacting the pads as the board moves over the roller. Solder is then selectively applied to the pads by directing a wave of solder thereto such that the solder sticks essentially only to the pads.

In accordance with another aspect, the invention is an apparatus for soldering a component to pads on a printed circuit board. The apparatus comprises a roller rotatably mounted above a flux reservoir and positioned such that the roller picks up flux from the reservoir and deposits it on said pads as the board moves over the roller. The apparatus further comprises a solder reservoir including means for producing a solder wave in a narrow area with a width essentially equal to the width of the pads.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
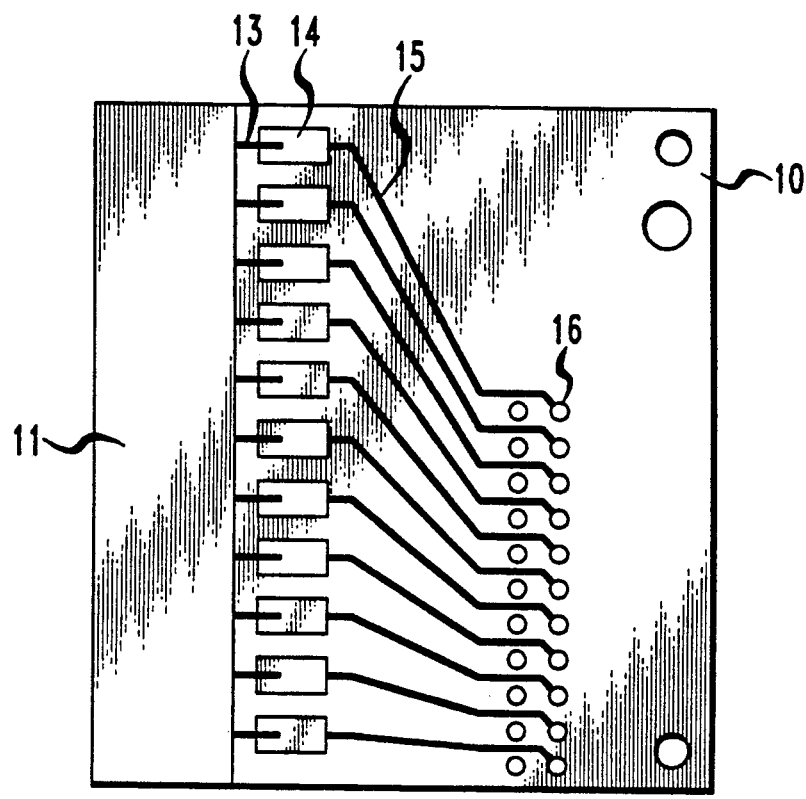
FIGS. 1 and 2 are side and top views, respectively, of a typical connector and circuit board combination which can utilize the present invention.
Figure 2:
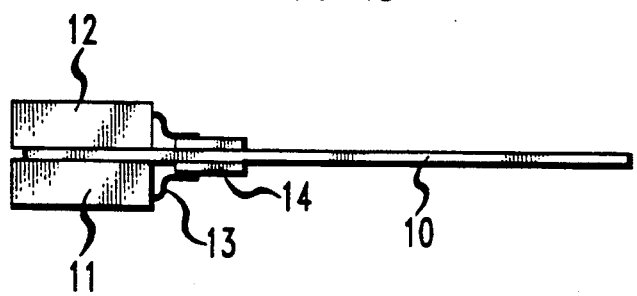

FIGS. 1 and 2 illustrate a typical circuit pack which may be soldered by the present invention. The pack includes a printed circuit board, 10, and a pair of electrical connectors, 11 and 12, one on each major surface of the board at one edge. The connectors in the example are of the socket type which include tynes (not shown) within the connector housing for receiving conductive pins therein. Electrically coupled to each tyne is a conductive tail, e.g., 13, which extends out of the connector housing. Each tail needs to be electrically connected to one of a plurality of pads, e.g., 14, formed on the major surfaces of the board, 10. Each pad, in turn, is electrically connected to some other portion of the board by a deposited conductive line, e.g., 15. In this example, the pads are shown as connected to via holes, e.g., 16, in order to electrically connect the two sides. However, it will be appreciated that a wide variety of components can be mounted on the board and coupled to the pads.

The pads and conductive lines are typically made of copper with a thickness of approximately 0.035 millimeter. The pads typically measure 2.0 by 3.0 millimeters and are usually spaced approximately 1.8 to 2.0 millimeters from the connector housing.

The tails, e.g., 13, are initially unattached to their corresponding pads, e.g., 14. The tails are then fluxed and subsequently soldered to the pad in a manner which keeps flux away from the connector housing and requires no cleaning after the soldering operation.

Figure 3:
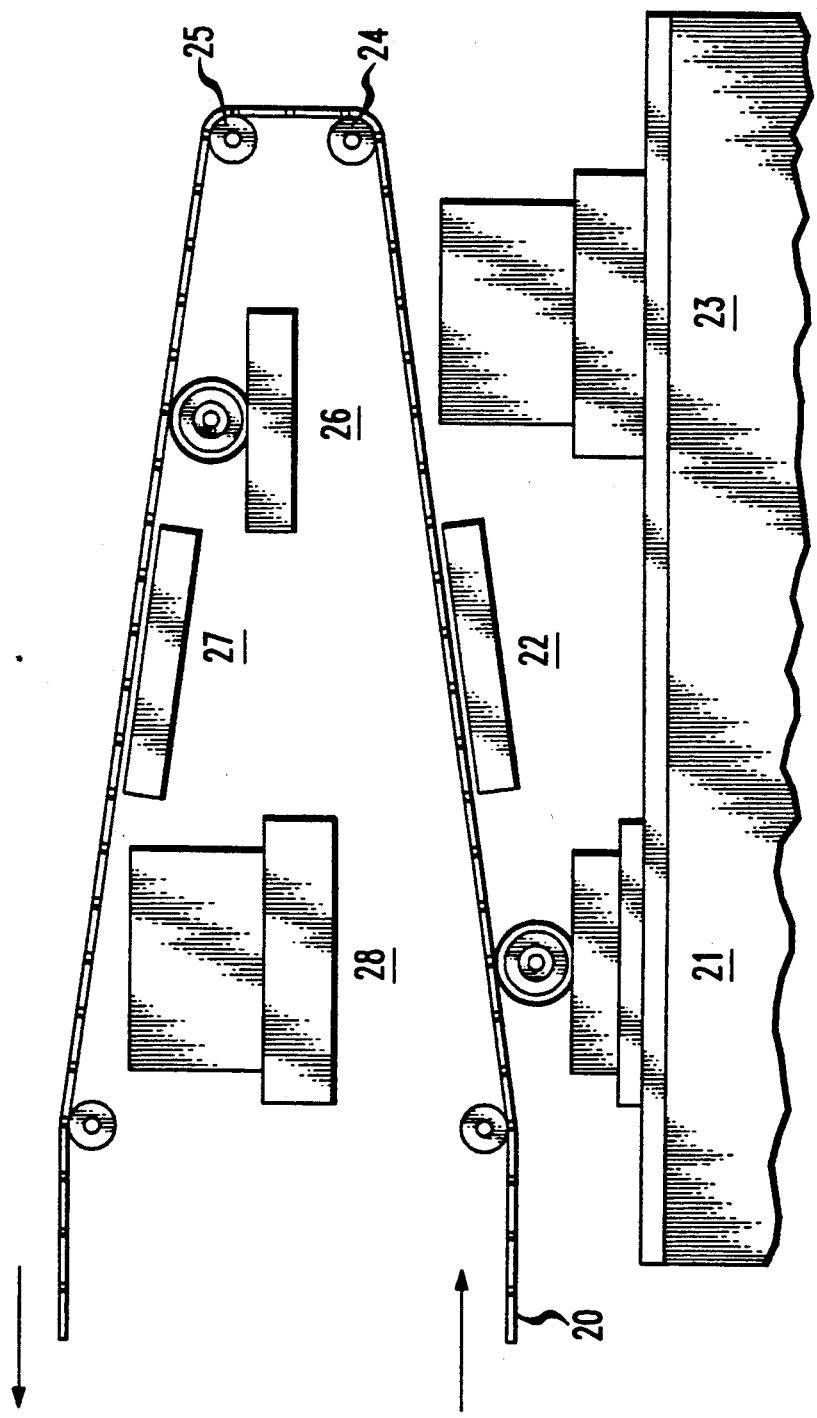
FIG. 3 is a highly schematic representation of the apparatus according to an embodiment of the invention.

FIG. 3 illustrates schematically the apparatus and method of the invention. Each component shown in FIGS. 1 and 2 is snapped into a holder (e.g., 30 of FIGS. 4 and 5) on a conveyor belt, 20. The conveyor carries the components over a first station, 21, which applies flux to the pads and will be described in more detail below. The components then pass over station 22 where they are heated. This station typically includes a 12 element preheater. The components are usually heated to a temperature within the range 93.3 to 104.4 degrees C.

The components then pass over station 23 where solder is deposited by wave soldering to the areas where flux was previously applied. This portion will also be described in more detail below. The solder employed is typically 60 percent tin and 40 percent lead.

The conveyor then passes wheels 24 and 25 which causes the components to flip over to allow processing of the opposite surfaces of the components. Thus, the components pass over stations 26, 27 and 28 which are essentially equivalent to stations 21, 22 and 23, respectively, so that when the components reach the end of the line, pads and tails on both major surfaces of the boards will be soldered.

Figure 4:
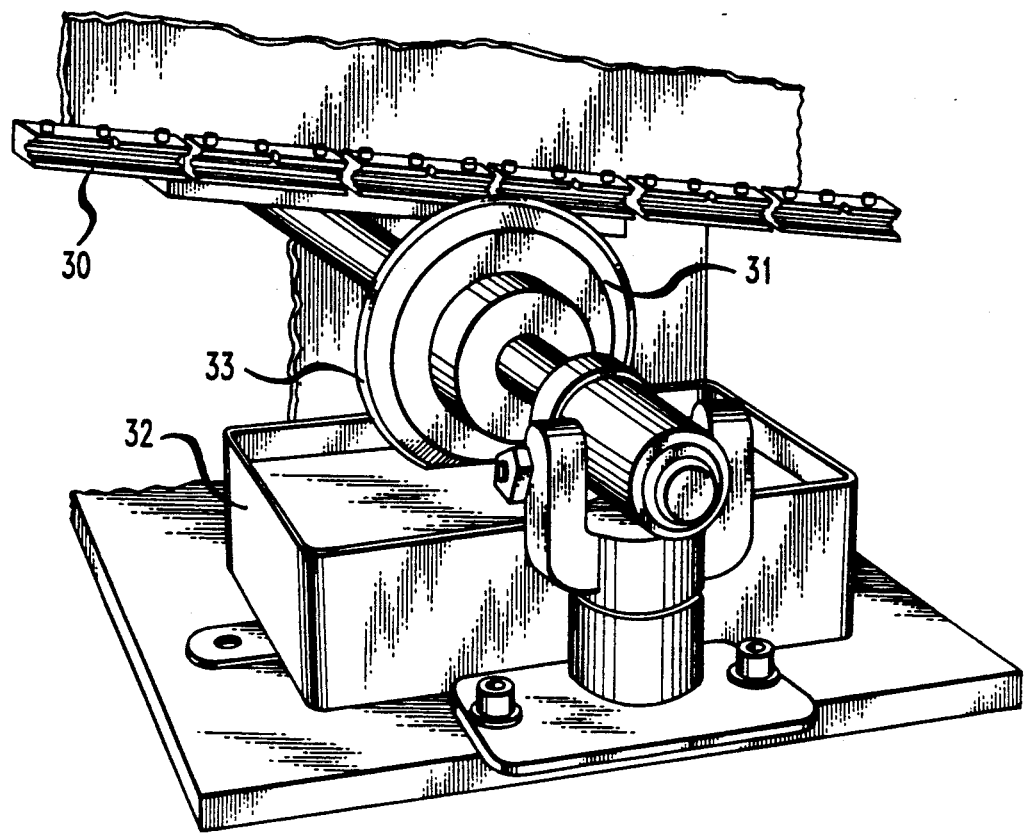
FIGS. 4 and 5 are different views of a portion of the apparatus in accordance with the same embodiment.
Figure 5:
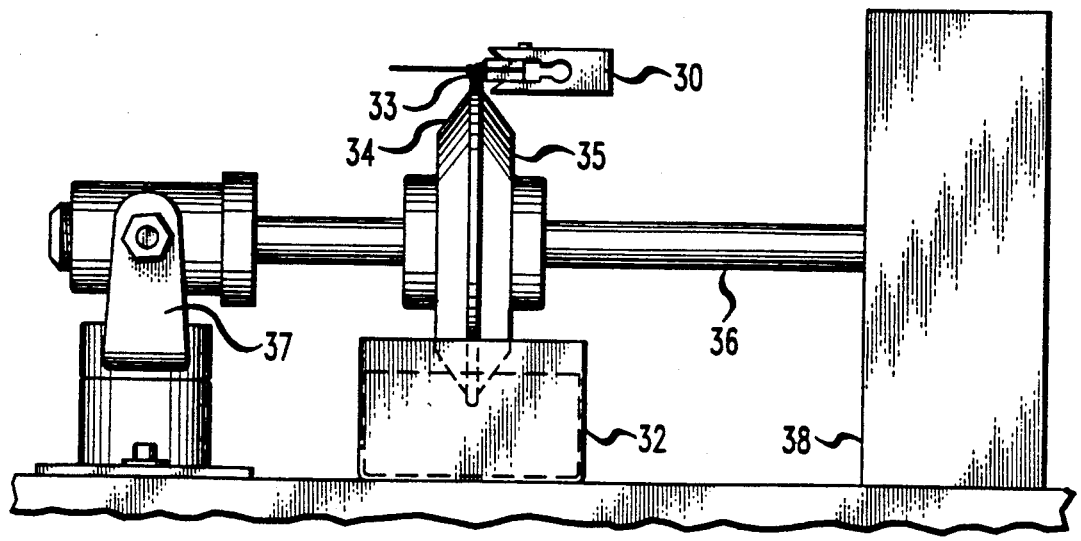

FIGS. 4 and 5 illustrate in more detail the station, 21 or 26, for applying flux to the components. The components themselves have been omitted from FIG. 4 to illustrate the apparatus. A roller, 31, is mounted above a reservoir, 32, which includes the liquid flux material. The roller in this embodiment is an open cell rubber disc, 33, sandwiched between two stainless steel press plates, 34 and 35 of FIG. 5. The disc and plates are mounted to a shaft, 36, which is held at one end by a support, 37, and at the other end is driven by a motor, 38. The shaft and the roller are mounted so as to be free to rotate in either a clockwise (station 21) or counterclockwise (station 26) direction by the action of the motor 38.

The width of the rubber disc is essentially the width of the pads (e.g., 14 of FIG. 1) of the components but can be adjusted, e.g., by stacking discs, to accommodate varying pad widths. The roller is mounted so that a minimum (approximately 3.0 millimeters) portion of the disc is submerged in the flux in the reservoir 32.

Thus, in operation, the roller is driven by the motor at a speed which matches the speed of the conveyor. That is, the RPM of the motor is chosen to give a tangential speed of the disc which essentially equals the speed of the conveyor. In a typical example, an RPM of approximately 4 RPM would be appropriate for a conveyor speed of 364 millimeters per minute. As the components of FIGS. 1 and 2 move over the roller, the disc will make contact with the pads and with the tails attached thereto, thus depositing the flux from the reservoir onto the row of pads (e.g., 14) of each component. The flux will be confined to the pads and to the spaces therebetween since, as previously noted, the width of the disc 33 is essentially equal to the width of the pads.

In a typical example, a low solids flux comprising approximately 98 percent isopropyl alcohol and approximately 2 percent activator, such as sold under the name LONCO 27F, is deposited onto the pads and tails to a thickness within the range 0.05 to 0.08 millimeter by means of the roller. It may be possible to dispense with the motor and cause the roller to rotate solely by the friction of the components contacting the disc. Alternatively, a clutch arrangement (not shown) would also be supplied in combination with the shaft and motor so that the roller could turn slowly to keep the surface of the disc wet until such time as the disc was contacted by the components. Then, the clutch could disengage the motor and the roller would be rotated by the components. It will also be appreciated that several rollers could be mounted on a single shaft to apply flux to parts with several rows of pads. In such cases, the rollers could have varying widths to accommodate varying pad widths in different rows.

Figure 6:
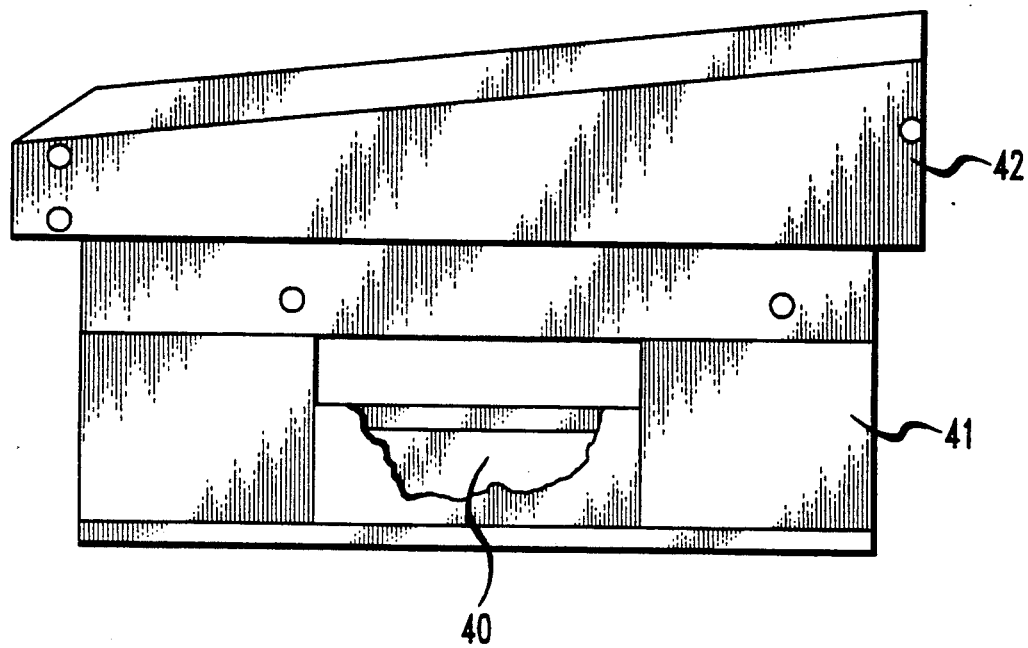
FIG. 6 is a side view of a further portion of the apparatus in accordance with the same embodiment.
Figure 7:
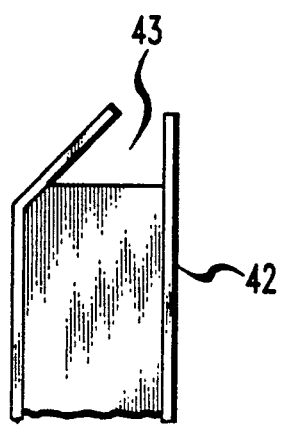
FIG. 7 is an enlarged view of a portion of the apparatus of FIG. 6.

FIGS. 6 and 7 illustrate in more detail the soldering stations, 23 and 28 of FIG. 3. Liquid solder, 40, such as 60 percent tin and 40 percent lead, is provided within a standard solder pot or reservoir, 41. The pot includes a standard pump (not shown) which creates solder waves which will contact the components as they pass over the pot. The top of the pot is covered by a plate element and a narrow columnar element, 42, (weir). The element 42 has a narrow opening, 43 of FIG. 7, which is essentially the same width as the pads (e.g., 14 of FIG. 1) of the components to be soldered. The element 42 is mounted so that its length dimension is essentially parallel to the conveyor and the opening 43 is aligned with the component pads.

Thus, in operation, as each component passes over the solder station, waves of solder will be applied essentially only to the pads (e.g., 14 of FIG. 1) of each component through the narrow opening, 43, in the element 42. The solder will stick to the solder pads coated at the flux station (21 or 26 of FIG. 1) so that solder is selectively applied to the pads and tails. (It will be appreciated that, although flux is also applied to spaces between the pads, these spaces are covered by a solder mask (not shown) to which the solder will not stick.) The solder will burn off all the deposited flux. Thus, the need for post-solder cleaning is avoided. The thickness of the solder layer is typically in the range 0.1 to 0.4 millimeter.

As before, a plurality of elements, 42, may be provided over the solder pot 41 to apply solder to a plurality of rows of pads on the components.

The invention is most useful where the pads have a narrow width, usually in the range 2.0 to 3.0 millimeters, and where the pads are close to the connector housing (11, 12), usually a distance of no greater than 2 millimeters so that flux needs to be kept out of the housing.

Various modifications of the invention will become apparent to those skilled in the art. All such variations which basically rely on the teachings through which the invention has advanced the art are properly considered within the scope of the invention.

We claim:

1. A method of soldering a component to pads on a printed circuit board comprising:
    applying a flux selectively to the pads by means of a roller which is rotatably mounted above a flux reservoir and which includes a rubber member so that the rubber member picks up flux from the reservoir and applies it by contacting the pads as the board moves over the roller; and
    applying solder selectively to the pads by directing a wave of solder thereto such that the solder adheres essentially only to the pads covered by the flux and burns off all the deposited flux so that no post-solder cleaning is needed.

2. The method according to claim 1 wherein the component and board are mounted to a conveyor, and the roller is rotated by a motor which sets the tangential speed essentially equal to the speed of the conveyor.

3. The method according to claim 1 wherein the solder is applied through an element with a narrow opening aligned with the pads and essentially equal to the width of the pads.

4. The method according to claim 1 wherein the thickness of the flux is within the range 0.05 to 0.08 millimeter and the thickness of the solder is within the range 0.1 to 0.4 millimeter.

5. The method according to claim 1 wherein the component is an electrical connector mounted on an edge of the circuit board, said connector including a housing and conductive tails extending from the housing and making physical contact with the pads.

6. The method according to claim 5 wherein the pads are situated in a row which is a distance of no greater than 2 millimeters from the connector housing.

7. Apparatus for soldering a component to pads on a printed circuit board comprising:
    a roller rotatably mounted above a flux reservoir, said roller including a rubber disc mounted between two plates on a shaft and positioned such that the disc picks up flux from the reservoir and deposits it on said pads as the board moves over the roller; and a solder reservoir including means for producing a solder wave in a narrow area with a width essentially equal to the width of the pads.

8. The apparatus according to claim 7 further comprising a conveyor for transporting the board and a motor which rotates the roller at a tangential speed essentially equal to that of the conveyor.

9. The apparatus according to claim 7 wherein the means for producing the solder wave comprises a columnar element mounted over a solder pot, said element having an opening which is aligned with the pads and has a width essentially equal to that of the pads.

* * * * *